United States Patent
Liu et al.

(10) Patent No.: US 11,677,013 B2
(45) Date of Patent: Jun. 13, 2023

(54) SOURCE/DRAIN EPITAXIAL LAYERS FOR TRANSISTORS

(71) Applicant: TAIWAN SEMICONDUCTOR MANUFACTURING CO., LTD., Hsinchu (TW)

(72) Inventors: Wei-Min Liu, Hsinchu (TW); Li-Li Su, ChuBei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 5 days.

(21) Appl. No.: 17/072,418

(22) Filed: Oct. 16, 2020

(65) Prior Publication Data
US 2021/0305403 A1    Sep. 30, 2021

Related U.S. Application Data (60) Provisional application No. 63/002,293, filed on Mar. 30, 2020.

(51) Int. Cl.
*H01L 29/66* (2006.01)
*H01L 29/04* (2006.01)
(Continued)

(52) U.S. Cl.
CPC ........ *H01L 29/6681* (2013.01); *H01L 29/045* (2013.01); *H01L 29/0847* (2013.01); *H01L 29/7851* (2013.01)

(58) Field of Classification Search
CPC ............... H01L 29/6681; H01L 29/045; H01L 29/0847; H01L 29/7851; H01L 29/66795
See application file for complete search history.

(56) References Cited

U.S. PATENT DOCUMENTS 7,015,116 B1  3/2006  Lo et al.
8,962,400 B2  2/2015  Tsai et al.
(Continued)

FOREIGN PATENT DOCUMENTS

KR    20160011126 A    1/2016
KR    20170061724 A    6/2017
(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Christine A Enad
(74) *Attorney, Agent, or Firm* — Sterne, Kessler, Goldstein & Fox P.L.L.C.

(57) ABSTRACT

The present disclosure is directed to methods for forming source/drain (S/D) epitaxial structures with a hexagonal shape. The method includes forming a fin structure that includes a first portion and a second portion proximate to the first portion, forming a gate structure on the first portion of the fin structure, and recessing the second portion of the fin structure. The method further includes growing a S/D epitaxial structure on the recessed second portion of the fin structure, where growing the S/D epitaxial structure includes exposing the recessed second portion of the fin structure to a precursor and one or more reactant gases to form a portion of the S/D epitaxial structure. Growing the S/D epitaxial structure further includes exposing the portion of the S/D structure to an etching chemistry and exposing the portion of the S/D epitaxial structure to a hydrogen treatment to enhance growth of the S/D epitaxial structure.

20 Claims, 11 Drawing Sheets

(51) Int. Cl.
*H01L 29/08* (2006.01)
*H01L 29/78* (2006.01)

(56) References Cited

U.S. PATENT DOCUMENTS

| | | |
|---|---|---|
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,297,690 B2 | 5/2019 | Li et al. |
| 10,707,328 B2 | 7/2020 | Sung et al. |
| 2010/0167505 A1* | 7/2010 | Chew ............... H01L 21/02532 438/503 |
| 2015/0206956 A1* | 7/2015 | Kim .................. H01L 29/6656 438/294 |
| 2017/0178962 A1* | 6/2017 | Dube ................ H01L 21/0245 |
| 2017/0207095 A1* | 7/2017 | Lee .................. H01L 29/66795 |
| 2018/0151698 A1* | 5/2018 | Sung ............... H01L 21/02532 |

FOREIGN PATENT DOCUMENTS

| | | |
|---|---|---|
| TW | 201822292 A | 6/2018 |
| TW | 201841232 A | 11/2018 |

OTHER PUBLICATIONS

Luo, Jie-Xin, et al., "The Impact of Shallow-Trench-Isolation Mechanical Stress on the Hysteresis Effect of Partially Depleted Silicon-on-insulator n-Type Metal-Oxide-Semiconductor Field Effects," CHIN.PHYS.LETT. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

```
┌─────────────────────────────────────────────┐
│ Form a fin structure on a substrate with an │
│ isolation layer surrounding a bottom portion of │ ~ 210
│           the fin structure                 │
└─────────────────────────────────────────────┘
                       ▼
┌─────────────────────────────────────────────┐
│  Form source/drain (S/D) spacers on bottom  │ ~ 220
│    sidewall surfaces of the fin structure   │
└─────────────────────────────────────────────┘
                       ▼
┌─────────────────────────────────────────────┐
│ Etch the fin structure between the S/D spacers │
│  to recess the fin structure with respect to the │ ~ 230
│              isolation region               │
└─────────────────────────────────────────────┘
                       ▼
┌─────────────────────────────────────────────┐
│ Grow a S/D epitaxial structure on the recessed │
│ portion of the fin structure between the S/D │ ~ 240
│                  spacers                    │
└─────────────────────────────────────────────┘
```

SOURCE/DRAIN EPITAXIAL LAYERS FOR TRANSISTORS

CROSS-REFERENCE TO RELATED APPLICATION

This application claims the benefit of U.S. Provisional Patent Application No. 63/002,293 titled "Source/drain Epitaxial Layers for Transistor Reliability Improvement," which was filed on Mar. 30, 2020 and is incorporated herein by reference in its entirety.

BACKGROUND

Source/drain epitaxial layers formed in fin field effect transistors (finFETs) can suffer from material loss during subsequent processing operations—such as cleaning operations, etching operations, and thermal processing operations. Due to the aforementioned material loss, source/drain epitaxial layers can undergo a size reduction that leaves portions of the fin structures exposed. This in-turn results in transistor performance degradation, transistor performance variation, and reliability issues.

BRIEF DESCRIPTION OF THE DRAWINGS

Aspects of the present disclosure are best understood from the following detailed description when read with the accompanying figures.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The term "vertical," as used herein, means nominally perpendicular to the surface of a substrate.

In a fin-based field effect transistor ("finFET"), source/drain (S/D) epitaxial structures are grown in physical contact with end-portions of the transistor's fin structure so that each end-portion of the fin structure is substantially covered by a side surface of the S/D epitaxial structure. Since the S/D epitaxial structures include multiple crystalline epitaxial layers and can have crystallographic orientations with a higher growth rate than other crystallographic orientations, the final shape of the S/D epitaxial structures is controlled by the growth rate achieved along each crystallographic orientation. For example, a S/D epitaxial structure is grown into a diamond shape because a growth rate in a direction perpendicular to the (100) silicon crystal plane (e.g., $GR_{[100]}$) is higher than a growth rate in a direction perpendicular to the (111) silicon crystal plane (e.g., $GR_{[111]}$). The resulting diamond-shaped S/D epitaxial structures develop edge-like top surfaces at locations where the (111) silicon crystal planes meet. Due to width and height considerations in finFET design, the diamond-shaped S/D epitaxial structures are grown so that their edge-like top surfaces cover top corners of the end-portions of the fin structure.

S/D epitaxial structures are susceptible to material loss during subsequent processing, such as cleaning processes, etching processes, thermal processes, etc. As a result of the subsequent processing, the S/D epitaxial structures undergo a size reduction that can leave the top corners of the end-portions of the fin structures exposed. The aforementioned size reduction may not be uniform across every S/D epitaxial structure. For example, some S/D epitaxial structures may suffer a larger material loss than other S/D epitaxial structures. This material loss non-uniformity introduced by processing can vary the final dimensions of the S/D epitaxial structures and ultimately cause performance variations across the transistors. Further, exposed end-portions of fin structures become potential defect locations.

To address the aforementioned challenges, the embodiments described herein are directed to methods for forming S/D epitaxial structures with a hexagonal shape. The hexagonal-shaped S/D epitaxial structures described herein can be advantageous over other S/D epitaxial structures (e.g., diamond-shaped S/D epitaxial structures) because hexagonal-shaped S/D epitaxial structures sufficiently cover the end-portion of the fin structure, even after being subjected to a material loss induced by subsequent processing operations. In some embodiments, the hexagonal-shaped S/D epitaxial structures are grown so that top corners of the hexagonal-shaped S/D epitaxial structures abutting the end-portions of the fin structure are raised with respect to top corners of the fin structure. In some embodiments, the corners of the hexagonal-shaped S/D epitaxial structures proximal to the top corners of the fin structure are raised by about 2 nm or more above the top corners of the fin structure. In some embodiments, growth of hexagonal-shaped S/D epitaxial structures is achieved with the introduction of a hydrogen treatment during growth. The hydrogen treatment can enhance the growth rate in a direction perpendicular to the (111) silicon crystal plane (e.g., $GR_{[111]}$), according to some embodiments.

Figure 1A:
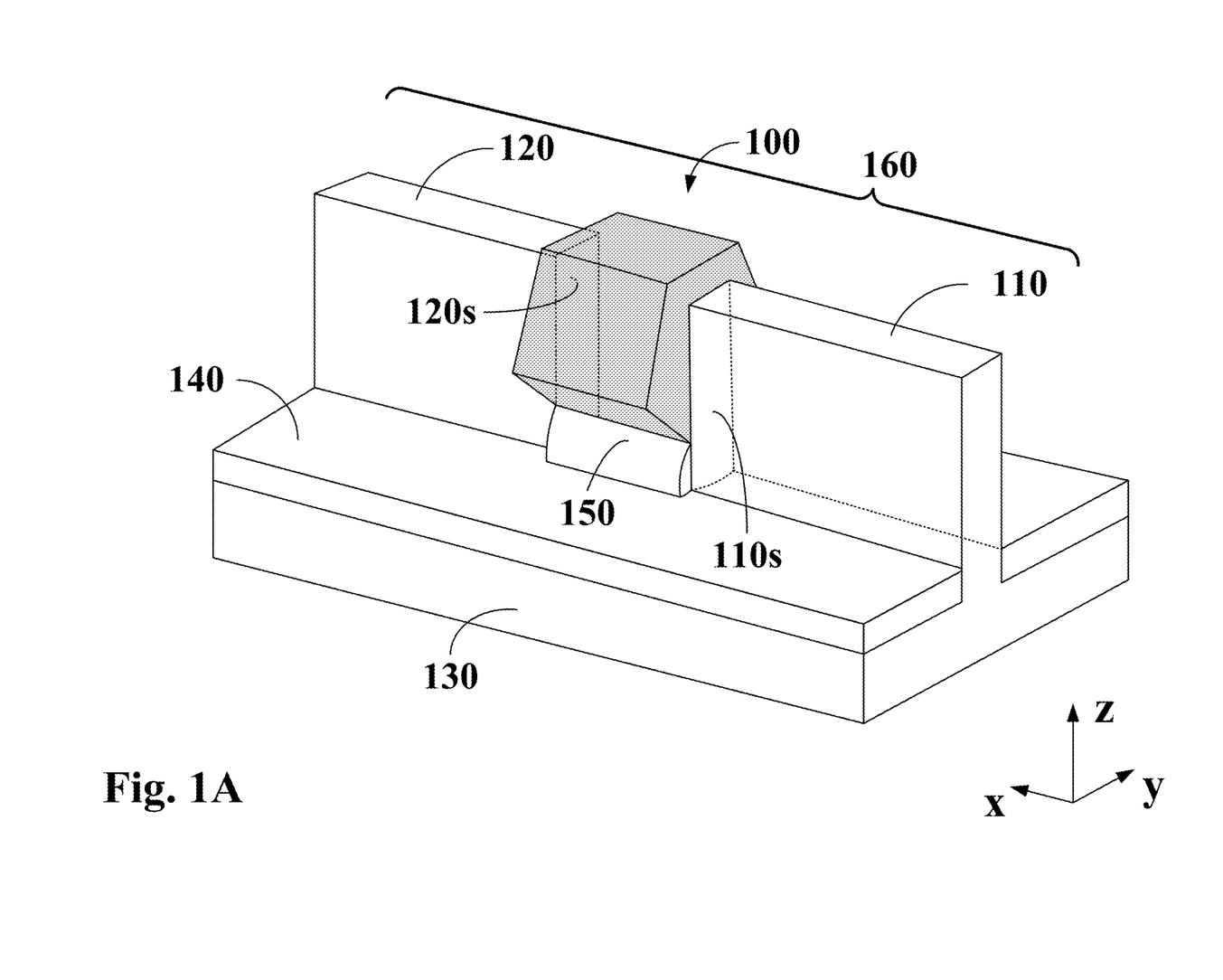
FIGS. 1A and 1B are isometric views of source/drain epitaxial structures formed between two fin structures, in accordance with some embodiments.

According to some embodiments, FIG. 1A is an isometric view of a hexagonal-shaped S/D epitaxial structure 100 ("S/D epitaxial structure 100") between neighboring fin structures 110 and 120 respectively formed on substrate 130. As shown in FIG. 1A, S/D epitaxial structure 100 substantially covers end-surfaces 110s and 120s of fin structures 110 and 120. Other structural elements shown in FIG. 1A include isolation layer 140 and S/D spacer 150.

Figure 1B:
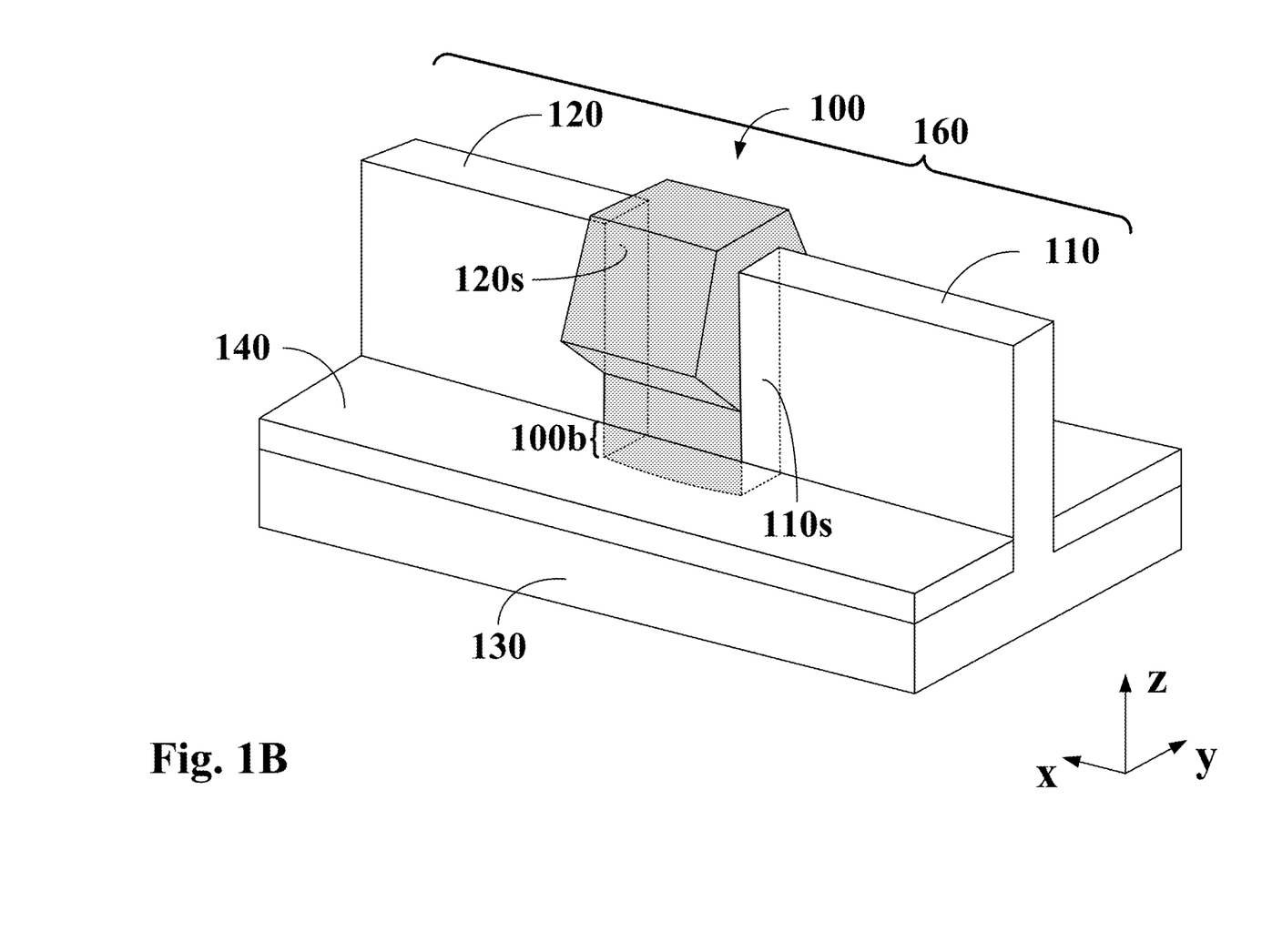

In some embodiments, fin structures 110 and 120 are end-portions of a single fin structure 160 separated by S/D epitaxial structure 100. For example, S/D epitaxial structure 100 is grown on a recessed portion of single fin structure 160. In FIG. 1A, the recessed portion of single fin structure 160, which is not shown, is located below a top surface of isolation layer 140. For example, FIG. 1B shows the structure of FIG. 1A without S/D spacer 150 so that a bottom section 100b of S/D epitaxial structure 100 on a recessed portion of single fin 160 is visible. As shown in FIG. 1B, S/D epitaxial structure 100 extends through isolation layer 140 onto end-surfaces 110s and 120s of end-portions 110 and 120 for fin structure 160.

Figure 1C:
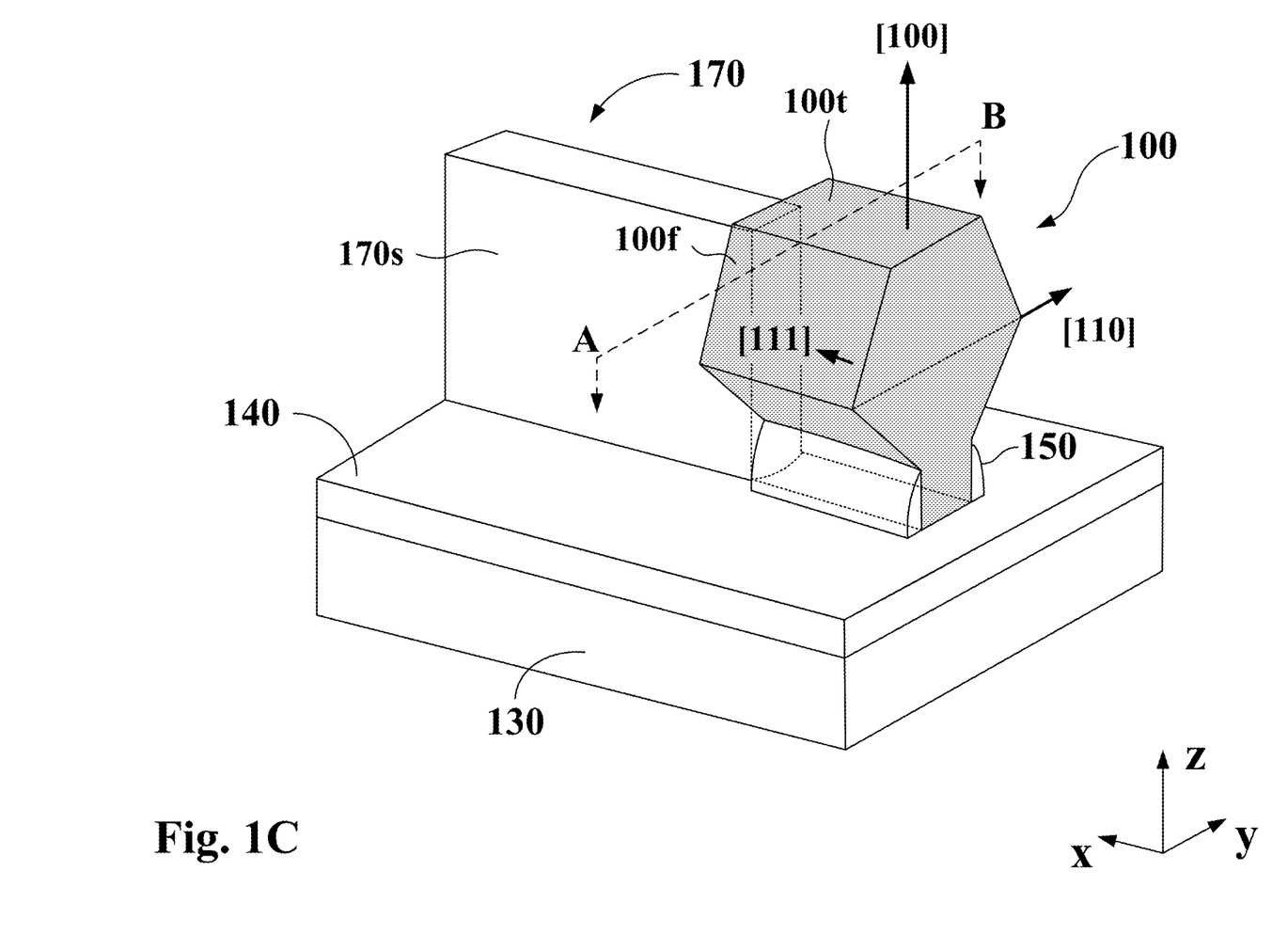
FIG. 1C is an isometric view of a source/drain epitaxial structure formed at an end-portion of a fin structure, in accordance with some embodiments.

In some embodiments, S/D epitaxial structure 100 is grown on a recessed end-portion of a fin structure, like fin structure 170 shown in FIG. 1C.

Based on the above, S/D epitaxial structure 100 can be grown between fin structures as shown in FIG. 1A, on a recessed middle portion of a single fin structure as shown in FIG. 1B, on a recessed end-portion of a single fin structure as shown in FIG. 1C, or combinations thereof. The aforementioned combinations are not limiting and additional combinations are within the spirit and the scope of this disclosure.

In some embodiments, each of the fin structures shown in FIGS. 1A, 1B, and 1C have a gate structure formed thereon. For ease of description, these gate structures are not shown in FIGS. 1A, 1B, and 1C. By way of example and not limitation, FIG. 1E shows the structure of FIG. 1A with an exemplary gate structure 190 formed on fin structure 120. In some embodiments, a similar gate structure (not shown) is formed on fin structure 110. In some embodiments, gate structure 190 is a sacrificial gate structure that includes a gate electrode 190a, a gate dielectric 190b, gate spacers 190c, and a capping layer 190d. In some embodiments, S/D epitaxial structure 100 abuts gate spacers 190c of gate structure 190. Gate spacers 190c electrically isolate gate electrode 190a from S/D epitaxial structure 100. In some embodiments, gate structure 190 is replaced with a metal gate structure after the formation of S/D epitaxial structure 100. Merely for ease of description, gate structures formed on the fin structures will not be shown in subsequent figures. However, gate structures, such as gate structure 190, on the fin structures presented herein are within the spirit and the scope of this disclosure.

In some embodiments, fin structures 160 and 170 shown in FIGS. 1A, 1B, and 1C include a single crystalline material or a stack of crystalline layers in the form of nano-sheets. The aforementioned crystalline materials (or crystalline nano-sheet layers) can include silicon (Si), germanium (Ge), a compound semiconductor (e.g., silicon carbide, gallium arsenide (GaAs), gallium phosphide (GaP), indium phosphide (InP), indium arsenide (InAs), indium antimonide (InSb)), an alloy semiconductor (e.g., silicon germanium SiGe, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or combinations thereof. Similarly, substrate 130 can include a crystalline material similar to or different than that of fin structures 110 and 120 or single fin structures 160 and 170.

Fin structures may be formed via patterning by any suitable method. For example, fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer formed over substrate 130 is patterned using a photolithography process. Spacers are formed alongside the patterned sacrificial layer using a self-aligned process. The sacrificial layer is then removed, and the remaining spacers may then be used to pattern the fin structures.

For example purposes and ease of description, substrate 130 and the fin structures discussed herein will be described in the context of monolithic crystalline silicon fin structures. Based on the disclosure herein, other materials and/or nano-sheet layers, as discussed above, can be used. These other materials and layers are within the spirit and scope of this disclosure.

In some embodiments, and in referring to FIG. 1C, S/D epitaxial structure 100 has a substantially planar top surface 100t that is parallel to silicon crystal plane (100). In some embodiments, silicon crystal plane (100) is parallel to the x-y plane—e.g., parallel to a top surface of substrate 130 and a top surface of fin structure 170. Compared to a diamond-shaped S/D structure, top surface 100t of S/D epitaxial structure 100 provides a larger contact area for a S/D contact formed thereon. Therefore, S/D epitaxial structure 100 provides a lower contact resistance compared to a diamond-shaped S/D epitaxial structure, according to some embodiments.

A direction perpendicular to silicon crystal plane (100) is denoted as [100] and is parallel to vertical direction z. According to some embodiments, facets 100f of S/D epitaxial structure 100 are parallel to silicon crystal plane (111) or parallel to its equivalent crystal planes {111}. In some embodiments, facets 100f are referred to as "(111) facets". A direction perpendicular to silicon crystal plane (111) or perpendicular to its equivalent crystal planes {111} is denoted as [111] as shown in FIG. 1C. In some embodiments, silicon crystal plane (110) is parallel to the x-z plane—e.g., parallel to sidewall surfaces 170s of fin structure 170. A direction perpendicular to (110) is denoted as [110] and is parallel to the y-z plane as shown in FIG. 1C.

Figure 1D:
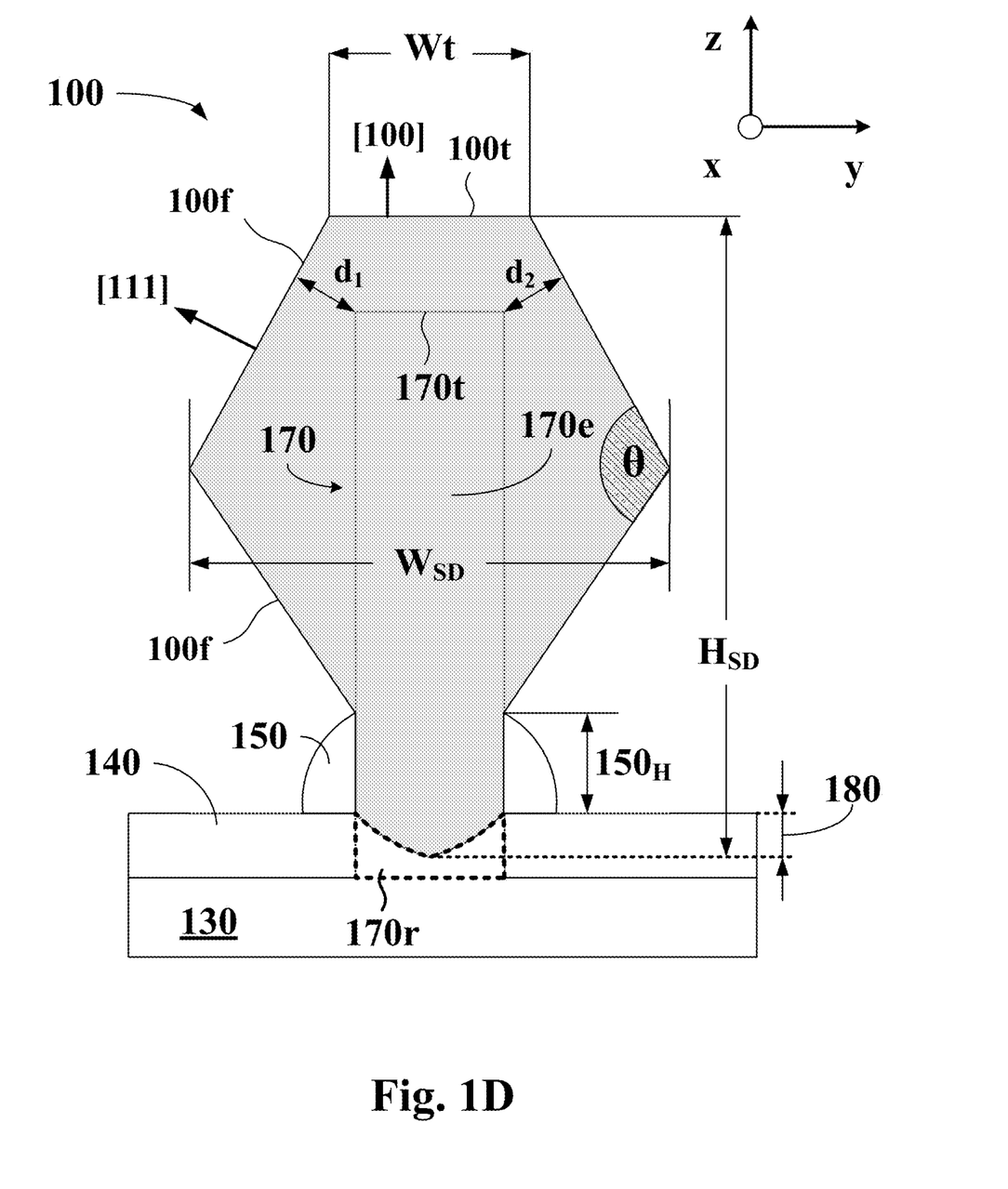
FIG. 1D is a cross-sectional view of a source/drain epitaxial structure formed at an end-portion of a fin structure, in accordance with some embodiments.
Figure 1E:
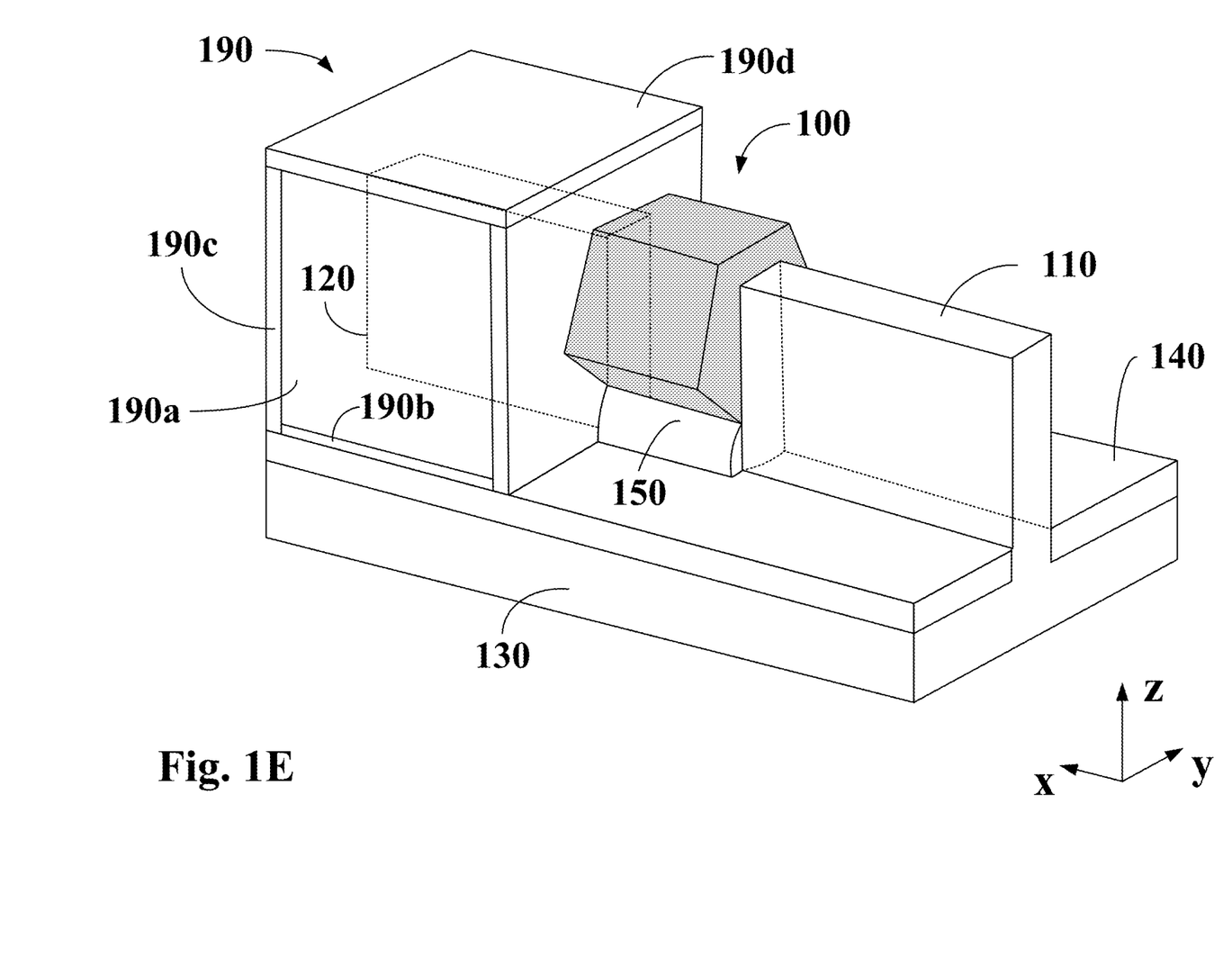
FIG. 1E is an isometric view of a source/drain epitaxial structure formed between two fin structures with one of the fin structures having a gate structure formed thereon, in accordance with some embodiments.

In some embodiments, FIG. 1D is a cross-sectional view of FIG. 1C along line AB. As discussed above, S/D epitaxial structure 100 substantially covers end-portion 170e of fin structure 170. More specifically, facets 100f—which are parallel to the (111) silicon crystal plane as discussed above—form an angle θ so that the shortest distances $d_1$ and $d_2$ between top facets 100f—proximal to top corners of the fin structures—and the top corners of fin structure 170 are greater than about 2 nm (e.g., $d_1$, $d_2$ >2 nm). This ensures that the top corners of fin structure 160 remain covered by S/D epitaxial structure 100 even when S/D structure 100 undergoes a size reduction during one or more subsequent processing operations, according to some embodiments. As shown in FIG. 1D, top surface 100t of S/D epitaxial structure 100 is raised with respect to top surface 170t of fin structure 170. For example, the height difference between 100t and 170t can be up to about 30 nm. The aforementioned features of S/D epitaxial structure 100 are also shown in the isometric views of FIGS. 1A, 1B, and 1C.

In some embodiments, width $W_{SD}$ of S/D epitaxial structure 100 is substantially similar to a width of a diamond-shaped S/D epitaxial structure. Therefore, S/D epitaxial structures 100 can achieve similar finFET densities to diamond-shaped S/D epitaxial structures. In some embodiments, width $W_{SD}$ ranges between about 5 nm and about 100 nm. As shown in FIG. 1D, width $W_{SD}$ of S/D epitaxial structure 100 is parallel to the y-z plane or the [110] direction shown in FIG. 1C. In some embodiments, a S/D epitaxial structure 100 with a width $W_{SD}$ narrower than about 5 nm has a d1 and a $d_2$ that is less than about 2 nm. Conversely, a S/D epitaxial structure 100 with a width $W_{SD}$ wider than about 100 nm can be touching S/D epitaxial structures from adjacent finFETs resulting in electrical shorts.

As shown in FIG. 1D, top surface 100t of S/D epitaxial structure 100 has a width $W_t$ parallel to width $W_{SD}$ (e.g., parallel to the y-z plane or the [110] direction). In some embodiments, width $W_t$ of top surface 100t ranges between about 2 nm and about 80 nm.

In some embodiments, angle θ, formed between facets 100f of S/D epitaxial structure 100, is between about 109° and 180°. According to some embodiments, angle θ is larger than an angle formed by the facets of a diamond-shaped S/D epitaxial structure. This is because the angle formed by the facets of diamond-shaped S/D epitaxial structure is limited to a range between about 40° and about 70°. Due to this constraint, the facets of a diamond-shaped S/D epitaxial structure intersect above top surface 170t of fin structure 170 and form an edge as opposed to a planar top surface 100t. This in turn limits the distance between the facets and the top corners of fin structure 170 to less than about 2 nm, even when the S/D width is substantially equal to $W_{SD}$ (e.g., between about 5 nm and about 100 nm). For example, in a diamond-shaped S/D epitaxial structure, the distance between the facets and the top corners of fin structure 170 (e.g., the equivalent of distances $d_1$ and $d_2$ shown in FIG. 1D) range between 0 nm and about 2 nm. This means that if a diamond-shaped S/D epitaxial structure experiences material loss due to one or more subsequent processing operations, the top corners of the fin structure can become exposed.

As discussed above, S/D epitaxial structure 100 is formed on a recessed portion of fin structure 170. For example, in referring to FIG. 1D, S/D epitaxial structure 100 is grown on a recessed portion 170r of fin structure 170. During the initial stages of the epitaxial growth, the S/D epitaxial layers of S/D epitaxial structure 100 are confined by S/D spacers 150. Hence, the bottom portion of S/D epitaxial structure 100 is facet-free and is grown vertically (e.g., along the z-direction) with the lateral growth being bounded by S/D spacers 150. In some embodiments, S/D spacers 150 are formed prior to recessing fin structure 170 and have a height 150H that ranges between about 10 nm and about 18 nm. In some embodiments, fin structure 170 is recessed below the top surface of isolation layer 140 by a recess amount 180 that ranges between about 5 nm and about 10 nm. Once the S/D epitaxial layers are grown beyond the confinement of S/D spacers 150, lateral growth resumes as shown in FIG. 1D. In some embodiments, height $H_{SD}$ of S/D epitaxial structure 100, as measured from the top surface of recessed portion 170r, ranges from about 90 nm to about 95 nm as shown in FIG. 1D.

Figure 2:
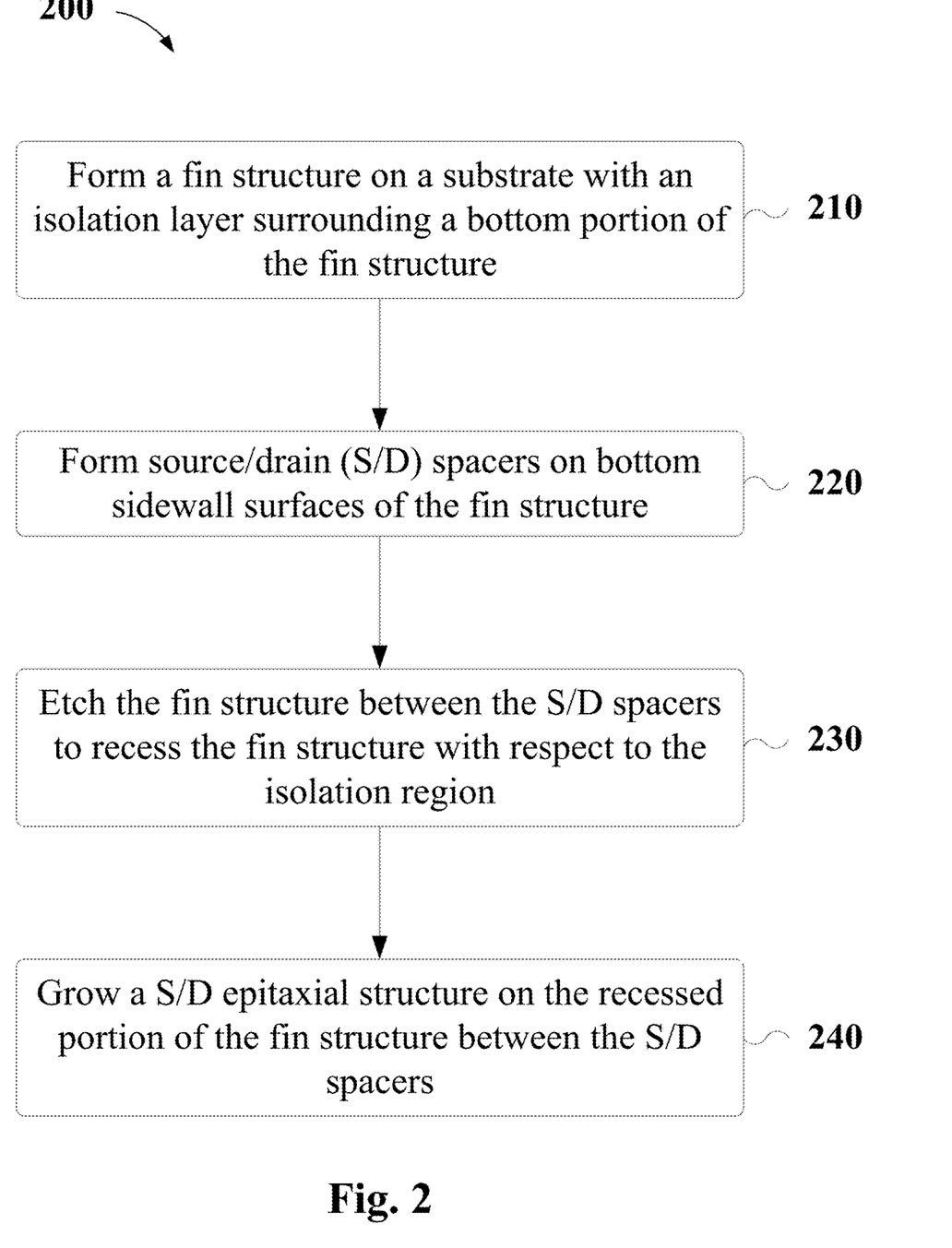
FIG. 2 is a flowchart of a method for forming hexagonal-shaped source/drain epitaxial structures, in accordance with some embodiments.

According to some embodiments, FIG. 2 is a flow chart of a method 200 that describes the fabrication process of S/D epitaxial structure 100 shown in FIGS. 1C and 1D. Method 200 is not limited to S/D epitaxial structure 100 shown in FIGS. 1C and 1D and can be used to form S/D epitaxial structure 100 shown in FIGS. 1A and 1B. Other fabrication operations may be performed between the various operations of method 200 and may be omitted merely for clarity. These various operations are within the spirit and the scope of this disclosure. Additionally, not all operations may be required to perform the disclosure provided herein. Some of the operations may be performed simultaneously, or in a different order than the ones presented in FIG. 2. Embodiments of the present disclosure are not limited to method 200. Exemplary method 200 will be described in reference to FIGS. 3 through 7.

Figure 3:
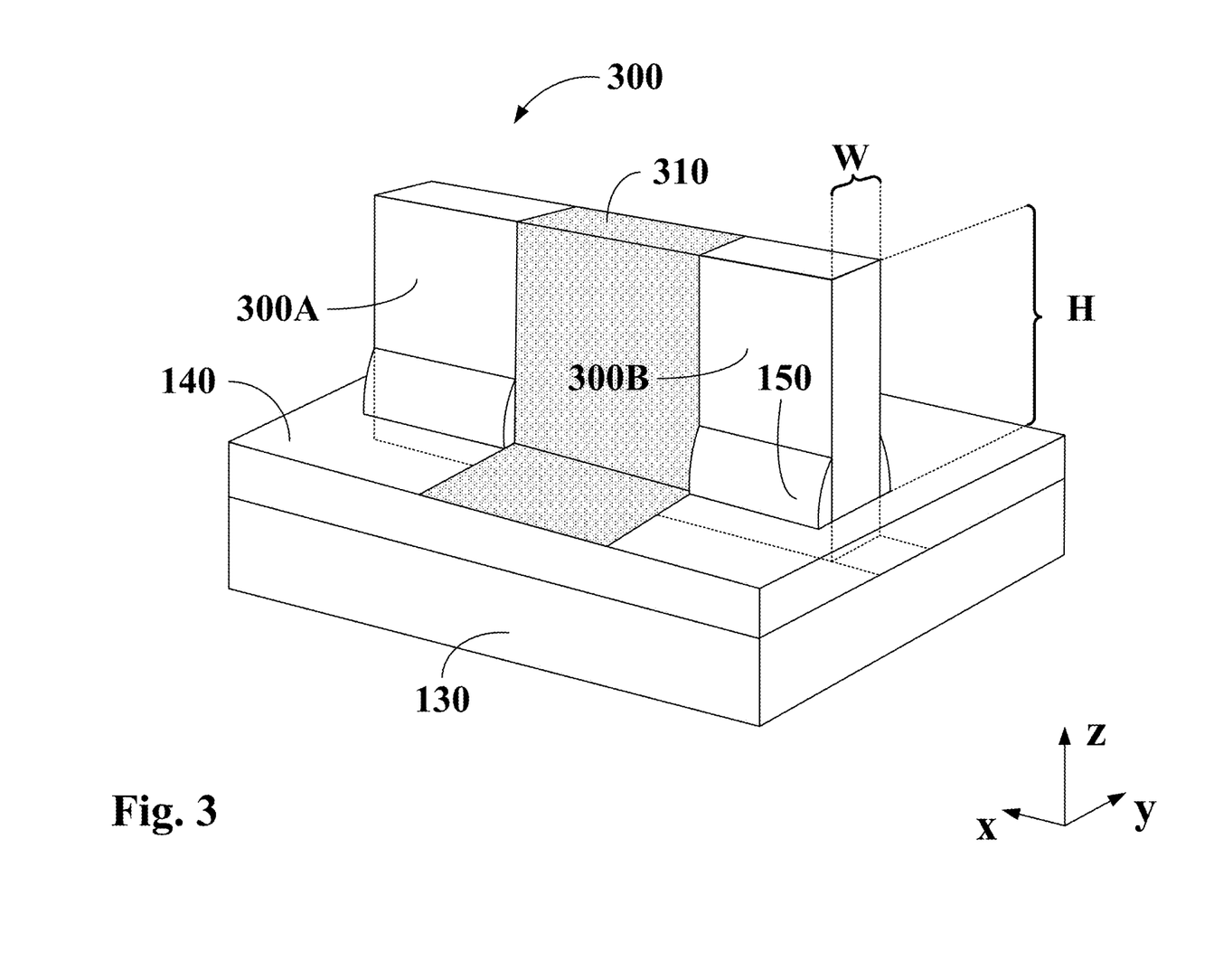
FIGS. 3 and 4 are isometric views of intermediate structures during the fabrication of a source/drain epitaxial structure, in accordance with some embodiments.

In referring to FIG. 2, method 200 begins with operation 210 and the process of forming a fin structure on a substrate with an isolation layer surrounding a bottom portion of the fin structure, like fin structure 300 shown in FIG. 3. In some embodiments, fin structure 300 is similar to fin structure 170 shown in FIG. 1C and fin structure 160 shown in FIGS. 1A and 1B. As discussed above with respect to fin structures 170 and 160, fin structure 300 can be monolithic (e.g., made from a single crystalline material) or may include alternating layers of different material (e.g., alternating epitaxially grown nano-sheets layers). For example, fin structure 300 can be made of crystalline silicon (C—Si) or can include a stack of alternating layers, such as alternating C—Si and crystalline silicon-germanium (SiGe) nano-sheet layers.

Even though, FIG. 3 includes only a single fin structure, this is not limiting. For example, additional fin structures, like fin structure 300, can be formed on substrate 130 as discussed above. For example, groups of two or more fin structures can be formed on different areas of substrate 130 according to a chip layout.

Fin structure 300 is separated from neighboring fin structures (not shown) by isolation layer 140. In some embodiments, isolation layer 140 is a silicon-based dielectric deposited over fin structure 300 and substrate 130, subsequently planarized with a chemical mechanical polishing (CMP) process, and recessed with an isotropic etching process to a height that covers a bottom portion of fin structure 300. The portion of fin structure 300 covered by isolation layer 140 is shown with dashed lines in FIG. 3 and in subsequent figures. As shown in FIG. 3, fin structure 300 is formed in physical contact with substrate 130, and isolation layer 140 is formed so that it covers bottom sidewall surfaces and bottom end-portions of fin structure 300. In some embodiments, and after the aforementioned recess operation, fin structure 300 has a height H above recessed isolation layer 140 that ranges between about 30 nm and about 35 nm. Further, fin structure 300 has a width W tht ranges between about 3.5 nm and 5 nm.

In some embodiments, a portion of fin structure 300 is covered (e.g., masked) by a gate structure represented in FIG. 3 by shaded region 310. By way of example and not limitation, the gate structure covers a middle portion of fin structure 300 and divides fin structure 300 into two exposed end portions 300A and 300B as shown in FIG. 3. The masked portions of fin structure 300 include a top portion and a sidewall portion of fin structure 300. Further, the gate structure extends on isolation layer 140 as shown by shaded region 310. In some embodiments, the gate structure extends on neighboring fin structures not shown in FIG. 3. By way of example and not limitation, neighboring fin structures, similar to fin structure 300, may share a single gate structure. In some embodiments, the gate structure represented by shaded region 310 functions as a mask layer for subsequent etching operations.

In referring to FIG. 2, method 200 continues with operation 220 and the process of forming S/D spacers 150 on bottom sidewall surfaces of fin structure 300—for example, on exposed end-portions 300A and 300B as shown in FIG. 3. By way of example and not limitation, S/D spacers 150 can be formed as follows. The S/D spacer material can be blanket-deposited on end-portions 300A and 300B, gate structure represented by shaded region 310, and isolation layer 140. Subsequently, the S/D spacer material is etched using an anisotropic etching process to remove the S/D spacer material from horizontal surfaces—e.g., the surfaces parallel to the x-y plane, such as horizontal surfaces of end-portions 300A and 300B, isolation layer 140, and shaded region 310. As a result, the remaining S/D spacer material on bottom sidewall surfaces of end-portions 300A and 300B forms S/D spacers 150. In some embodiments, S/D spacer material not removed from vertical sidewall surfaces of the gate structure may be removed, if desired, with additional photolithography and etching operations.

As discussed above, the height of S/D spacers 150 ranges between about 3 nm and about 5 nm. By way of example and not limitation, S/D spacer material can include a nitride (e.g., silicon nitride, silicon carbon nitride, silicon oxynitride, etc.) that can be selectively etched with respect to fin structure 300 (e.g., silicon) and isolation layer 140 (e.g., a silicon oxide based dielectric).

Figure 4:
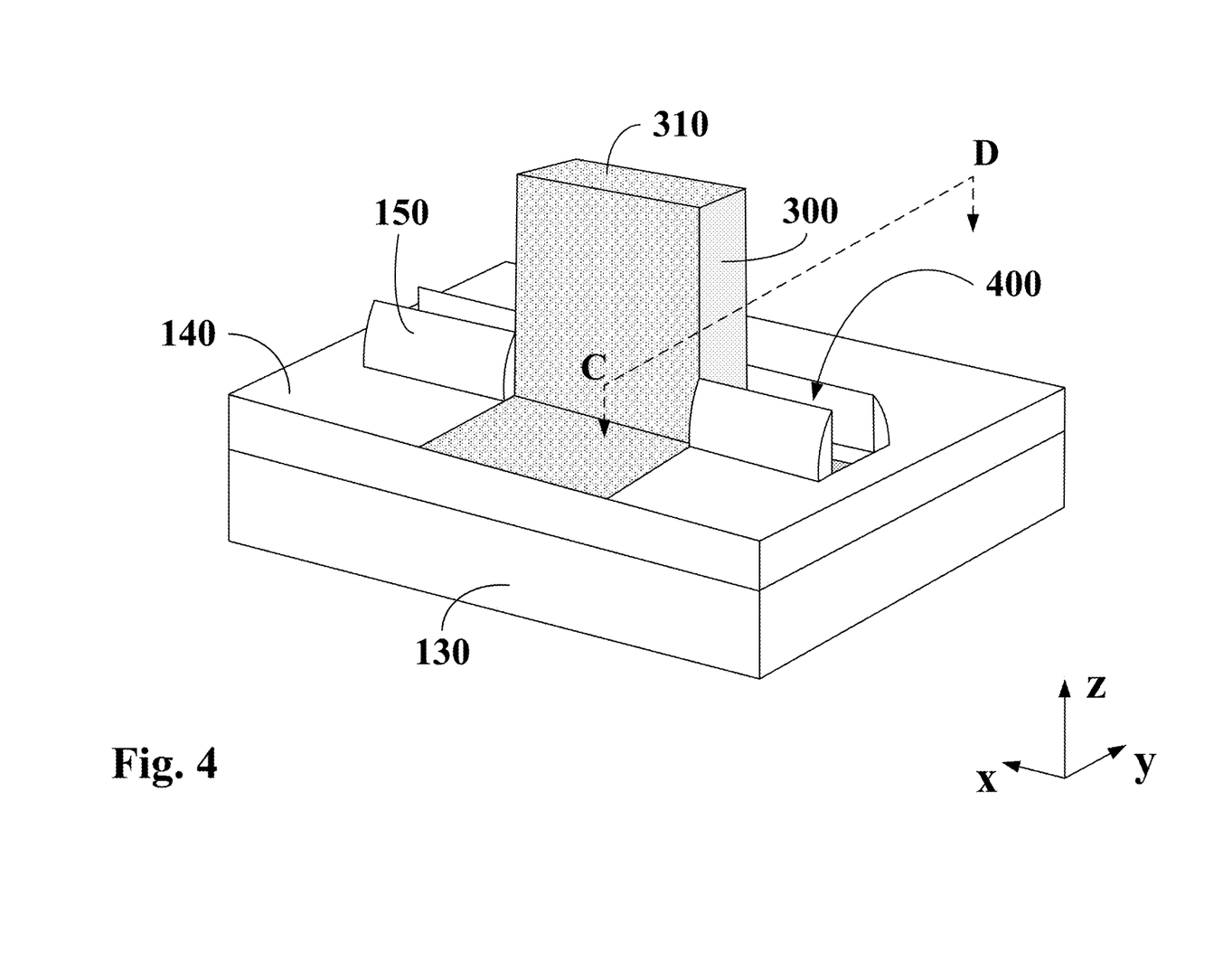

In referring to FIG. 2, method 200 continues with operation 230 and the process of etching fin structure 300 between S/D spacers 150 to recess fin structure 300 (e.g., to recess end-portions 300A and 300B) with respect to isolation layer 140 as shown in FIG. 4. In some embodiments, the portions of fin structure 300 masked by the gate structure (e.g., shaded area 310) are not recessed as shown in FIG. 4. In some embodiments, the etching chemistry used to recess fin structure 300 in operation 230 includes chlorine-based or fluorine-based gases, which can selectively etch silicon as opposed to nitrides or oxides. As discussed above, fin structure 300 is recessed below a top surface of isolation layer 140 by a recess amount 200 (e.g., shown in FIG. 1D) ranging between about 5 nm and about 10 nm. According to some embodiments, operation 230 forms a recess opening 400 between S/D spacers 150 as shown in FIG. 4.

In some embodiments, if fin structure 300 includes alternating nano-sheet layers, such as silicon and silicon germanium nano-sheet layers, the etching process can be a dry etching process, a wet etching process, or a combination thereof. In some embodiments, the etching chemistry is selective towards the Si nano-sheet layers and SiGe nano-sheet layers. In some embodiments, a dry etching process can include etchants having an oxygen-containing gas, a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)), a chlorine-containing gas (e.g., chlorine ($Cl_2$), chloroform ($CHCl_3$), carbon tetrachloride ($CCl_4$), and/or boron trichloride ($BCl_3$)), a bromine-containing gas (e.g., hydrogen bromide (HBr) and/or bromoform ($CHBr_3$)), an iodine-containing gas, other suitable etching gases and/or plasmas, or combinations thereof. A wet etching process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof. In some embodiments, the etching chemistry does not substantially etch isolation layer 140, S/D spacers 150, and the gate stack (e.g., shaded region 310).

Figure 5:
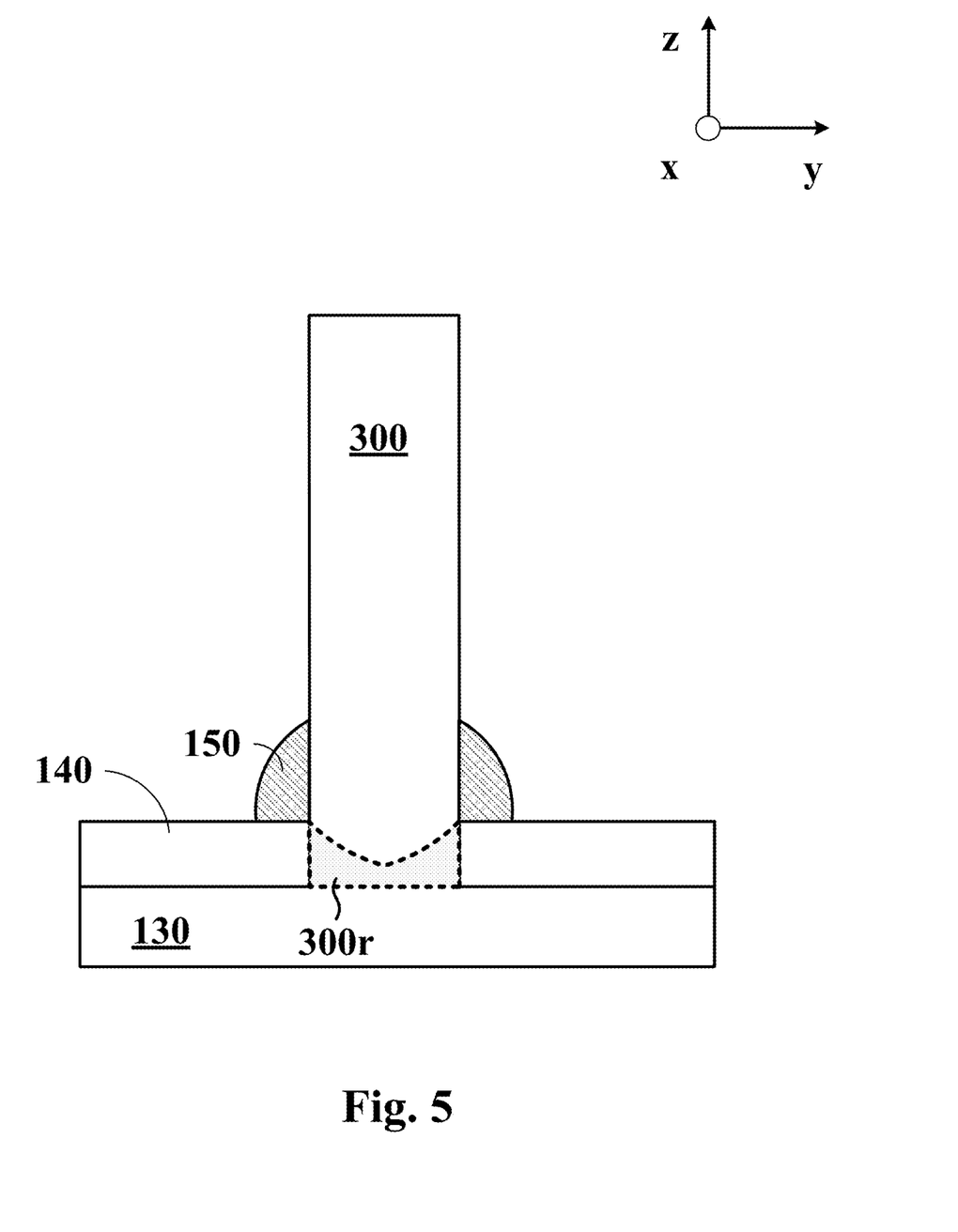
FIGS. 5-7 are cross-sectional views of intermediate structures during the fabrication of a source/drain epitaxial structure having a hexagonal shape, in accordance with some embodiments.

In some embodiments, FIG. 5 is a cross-sectional view of fin structure 300 shown in FIG. 4 across line CD. In FIG. 5, the un-recessed portion of fin structure 300—e.g., the portion of fin structure 300 masked by the gate structure—is located behind the recessed portion, 300r, of fin structure 300.

In referring to FIG. 2, method 200 continues with operation 240 and the process of growing S/D epitaxial structure 100 on recessed portion 300r of fin structure 300 between S/D spacers 150. In some embodiments, the S/D epitaxial structure for n-type finFETs includes strained carbon doped silicon (Si:C), phosphorous doped silicon (Si:P), or arsenic doped silicon (Si:As). The S/D epitaxial structure for p-type finFETs includes strained born doped SiGe (SiGe:B), boron doped Ge (G:B), or boron doped germanium-tin (GeSn:B). By way of example and not limitation, the amount of P incorporated into the S/D epitaxial structure for n-type finFETs can be about $3 \times 10^{21}$ atoms/$cm^{-3}$ and the amount of B incorporated into the S/D epitaxial structure for p-type finFETs can be about $1 \times 10^{21}$ atoms/$cm^{-3}$. In some embodiments, P and B dopants can be incorporated during the growth process by using, for example, phosphine and diborane respectively. By way of example and not limitation, the concentration of C in Si: C can be equal to or less than about 5 atomic % (at. %). The concentration of Ge in SiGe can be between about 20 at. % and about 40 at. %. Further, the concentration of Sn in GeSn can be between about 5 at. % and about 10 at. %. The aforementioned dopant and atomic concentrations are exemplary and not limiting. Therefore, other dopant and atomic concentrations are within the spirit and the scope of the embodiments described herein.

In some embodiments, the S/D epitaxial structure may include one or more layers formed sequentially with different dopant and/or atomic concentrations. According to some embodiments, the S/D epitaxial structure is grown with a hexagonal shape as shown for S/D epitaxial structure 100 in FIGS. 1C and 1D. By way of example and not limitation, the S/D epitaxial structure can be deposited by chemical vapor deposition (CVD) at temperatures of about 680° C. for Si:P and Si:As; between about 600° C. and about 700° C. for Si:C; about 620° C. for SiGe; between about 300° C. and about 400° C. for GeSn; and between about 500° C. and about 600° C. for Ge.

In some embodiments, Si:C, Si:P, or Si:As S/D epitaxial structures are formed with $SiH_4$ and/or dichlorosilane (DCS) precursors in the presence of $H_2$ and/or $N_2$. SiGe S/D epitaxial structures are formed with $SiH_4$, disilane ($Si_2H_6$), germane (GeH$_4$) precursors in the presence of H$_2$, N$_2$, helium (He), argon (Ar), or combinations thereof.

Figure 6:
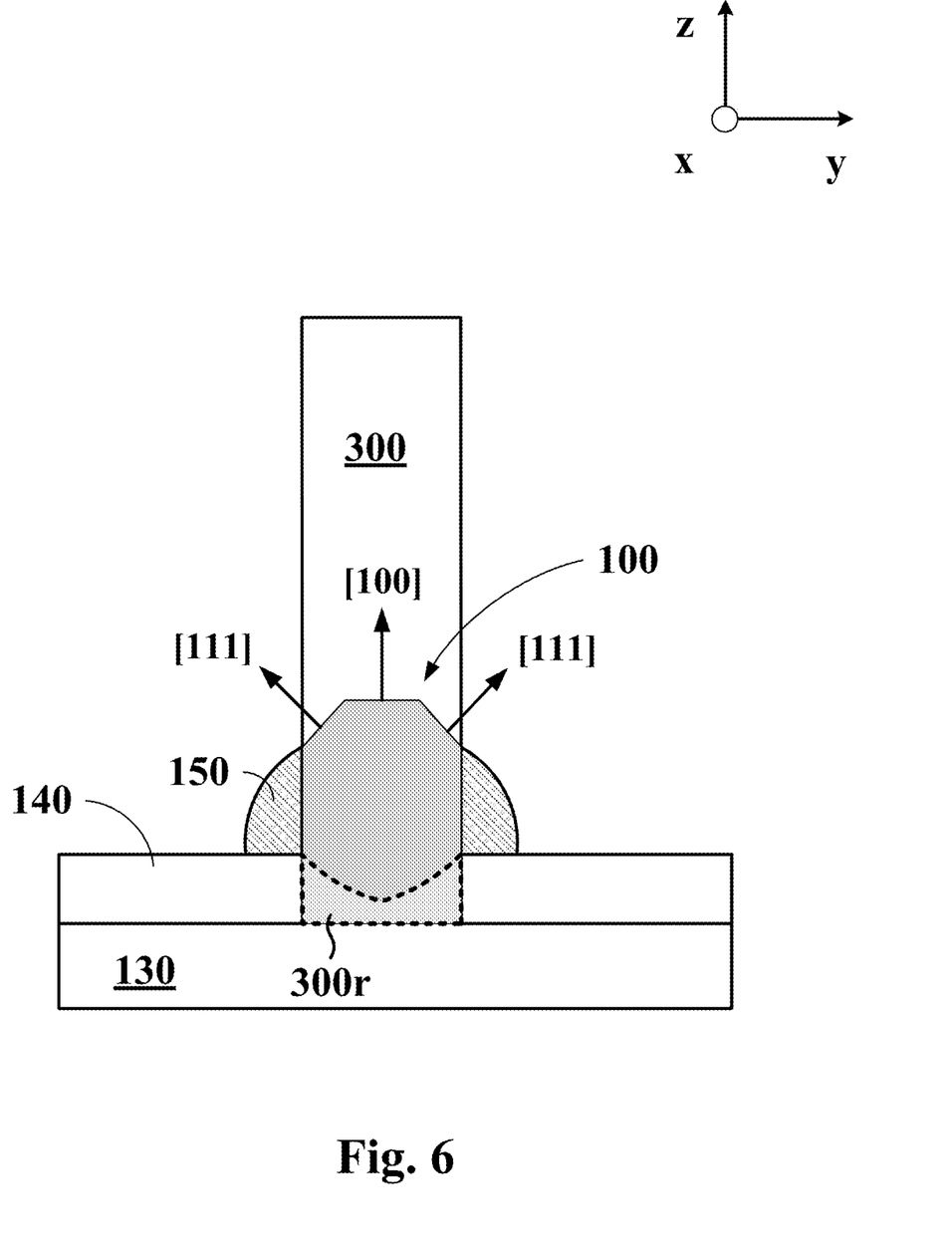

As discussed above, at the early stages of the growth process, S/D spacers 150 suppress the lateral growth of the S/D epitaxial structure and promote a vertical growth as shown for S/D epitaxial structure 100 in FIG. 6. As soon as S/D epitaxial structure 100 raises above S/D spacers 150, facets begin to form. In some embodiments, and in referring to FIG. 1C, if the growth rate along the [100] direction (GR$_{[100]}$) is substantially higher (e.g., 5 to 10 times higher) than the growth rate along the [111] direction (GR$_{[111]}$) (e.g., GR$_{[100]}$>>GR$_{[111]}$), a diamond-shaped S/D epitaxial structure is formed. On the other hand, if GR$_{[100]}$ is substantially lower (e.g., 5 to 10 times lower) than GR$_{[111]}$ (e.g., GR$_{[100]}$<<GR$_{[111]}$), a hexagonal-shaped S/D epitaxial structure is formed, like S/D epitaxial structure 100 shown in FIGS. 1A-D. In some embodiments, to achieve the hexagonal shape for S/D epitaxial structure 100 shown in FIGS. 1A-D, the growth conditions for S/D epitaxial structure 100 have to be adjusted so that the growth rate along the [111] direction is accelerated and the growth rate along the [100] direction is suppressed or retarded.

In some embodiments, hydrochloric acid (HCl) vapors are introduced during the growth process of S/D epitaxial structure 100 in method 200 to remove nuclei of S/D epitaxial material from surfaces of surrounding layers, such as the surfaces of isolation layer 140, S/D spacers 150, and the gate structure represented by shaded region 310. Therefore, HCl vapors remove (e.g., etch) any growth of S/D epitaxial material from surfaces outside the recessed end-portions 300r of fin structure 300. During the HCl vapor exposure, chlorine atoms are chemisorbed on exposed surfaces of the S/D epitaxial material and the surfaces of the S/D epitaxial structure become chlorine-terminated (e.g., the surfaces of the S/D epitaxial structure are chemically passivated with chlorine atoms). In some embodiments, the density of chemisorbed chlorine atoms on the {111} surfaces is higher compared to other surfaces—e.g., the {100} surfaces. In some embodiments, when the precursor and reactant gases are re-introduced and the growth process resumes, chlorine-terminated surfaces inhibit the growth of facet 100f compared to top surface 100t. In other words, the growth rate along the direction (GR$_{[111]}$) is artificially suppressed by the chlorine atoms chemisorbed on the surfaces of the S/D epitaxial structure. This is an undesirable side effect of chlorine-terminated surfaces because when GR$_{[111]}$ is greater than GR$_{[111]}$ the S/D epitaxial structure is grown into a diamond shape as discussed above. Further, for chlorine-terminated surfaces, the difference between GR$_{[100]}$ and GR$_{[111]}$ becomes growth temperature dependent. This means that the difference between GR$_{[100]}$ and GR$_{[111]}$ is greater for S/D epitaxial structures grown at a high temperature compared to S/D epitaxial structures grown at a low temperature. For example, GR$_{[100]}$ and GR$_{[111]}$ is greater for Si:C epitaxial layers grown at 700° C. than for GeSn epitaxial layers grown at a lower temperature (e.g., between about 300° C. and about 400° C.). This effect can produce p-type and n-type S/D epitaxial structures having different widths and facet angles.

In some embodiments, to form S/D epitaxial structures with consistent widths and facet angles, a hydrogen treatment ("H-treatment") is introduced after the HCl vapor exposure to boost the growth rate along the [111] direction (GR$_{[111]}$) and to promote the growth of hexagonal-shaped S/D epitaxial structures. In some embodiments, the H-treatment also enhances the growth rate along the direction (GR$_{[110]}$).

In some embodiments, the H-treatment results in a hydrogen-chlorine exchange process during which chlorine atoms on the surfaces of the S/D epitaxial structure are replaced by hydrogen atoms to form hydrogen-terminated (H-terminated) surfaces (e.g., the surfaces of the S/D epitaxial structure are chemically passivated with hydrogen atoms). The H-terminated surfaces result in a favorable growth rate shift between the [111] and [100] directions. In some embodiments, the H-treatment includes exposing the chlorine-terminated surfaces to atomic hydrogen (H$_2$) (e.g., hydrogen gas) or hydrogen radicals generated by a remote hydrogen plasma which has been "stripped" of its ions (e.g., with the use of an ion filter). In some embodiments, if ions are present in the plasma during the H-treatment, undesirable ion bombardment and/or charge transfer can occur. In some embodiments, the H-treatment is performed at a process pressure between about 0.1 Torr and about 10 Torr, and at a process temperature between about 50° C. and about 400° C. Radio frequency (RF) or direct current (DC) plasma sources are within the spirit and the scope of this disclosure. In some embodiments, the plasma power can range between about 200 W and about 5 kW.

In some embodiments, the growth process of the S/D epitaxial structure can be described as follows. The growth process begins with the introduction of the precursor and the reactant gases to the structure of FIG. 5 to initiate the growth of S/D epitaxial structure 100 as shown in FIG. 6. During this operation, thicker layers of S/D epitaxial material are formed on recessed portion 300r and substantially thinner layers are formed on surrounding surfaces, such as the surfaces of isolation layer 140, S/D spacers 150, and the gate structure represented by shaded region 310. Subsequently, the growth is interrupted and the structure is exposed to HCl vapors to remove the thin layers of S/D epitaxial material from surrounding surfaces outside recess portion 300r. During the HCl vapor exposure, a portion of S/D epitaxial material is also removed (e.g., etched) from the partially fabricated S/D epitaxial structure 100. However, since the thickness of S/D epitaxial material is thicker on recess portion 300r and thinner on other surfaces, sufficient S/D epitaxial material remains on portion 300r after the HCl vapor exposure operation. As discussed above, after the HCl vapor exposure, the exposed surfaces of the partially fabricated S/D epitaxial structure 100 become chlorine-terminated.

Subsequently, the partially fabricated S/D epitaxial structure 100 is exposed to a H-treatment which includes molecular hydrogen or ion-free hydrogen radicals so that the Cl-terminated surfaces can be converted to H-terminated surfaces. In some embodiments, when the precursor and reactant gases are re-introduced to resume the growth of S/D epitaxial structure 100, the H-terminated surfaces promote the growth of facets 100f (e.g., increase the growth rate along the [111] direction, GR$_{[111]}$) as compared to the growth rate along the [100] (e.g., GR$_{[100]}$). Therefore the growth mode of S/D epitaxial structure 100 shifts from GR$_{[100]}$>>GR$_{[111]}$ to GR$_{[100]}$<<GR$_{[111]}$. In some embodiments, GR$_{[111]}$ becomes between about 5 and about 10 times greater than GR$_{[100]}$ as a result of the H-treatment described above.

Figure 7:
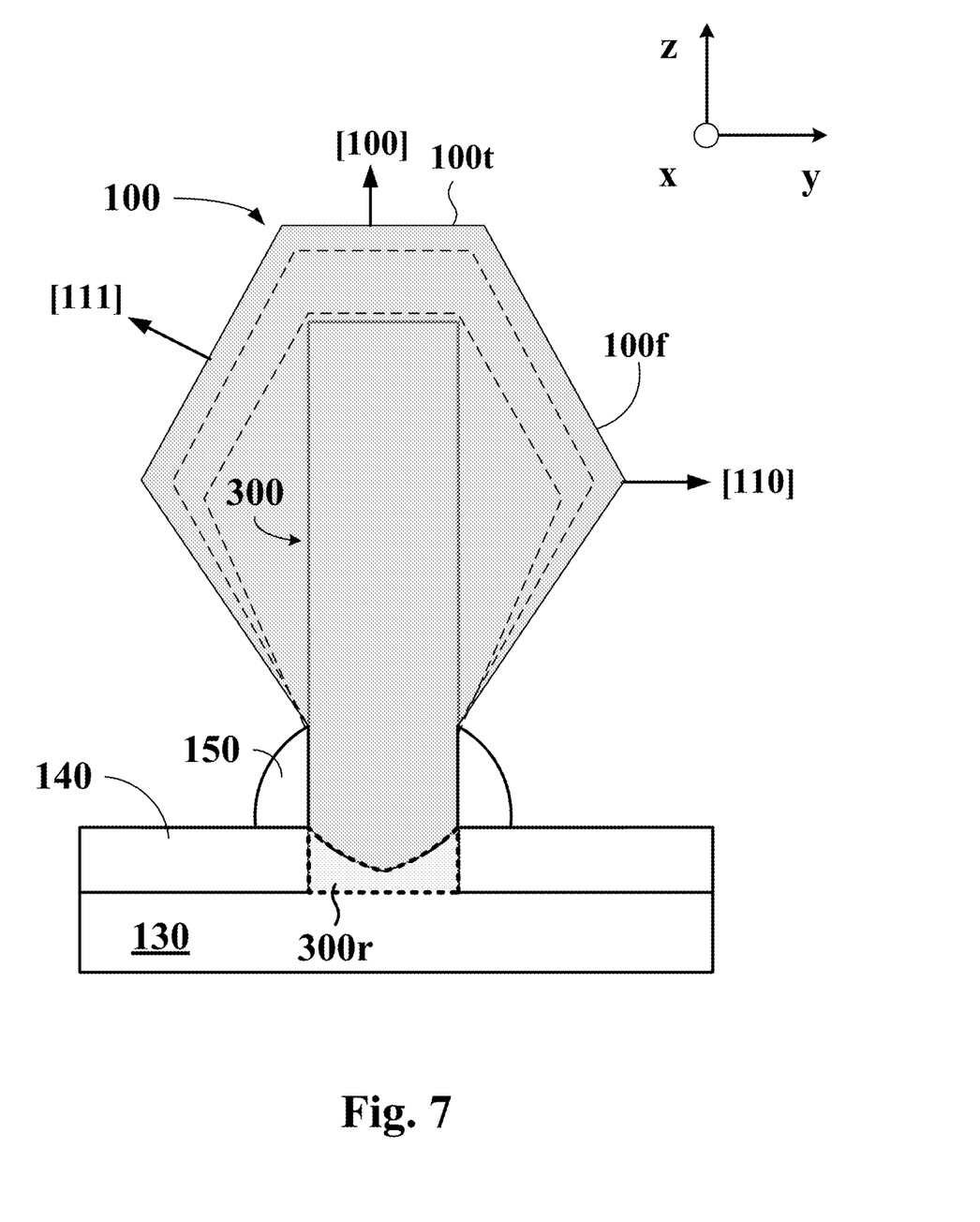

The above process operations of precursor exposure, HCl vapor exposure, and H-treatment can be repeated in N cycles to produce the hexagonal-shaped S/D epitaxial structure 100 shown in FIG. 7. In some embodiments, the H-treatment time (also referred to as "exposure time") in each cycle N is between about 1 s and about 100 s (e.g., about 10 s). In some embodiments, the exposure time in one cycle can be the same or different from the exposure times of other cycles. For example, in one cycle, the H-treatment can be about 10 s and in a subsequent cycle the H-treatment time can be about 10 s, longer than about 10 s, or shorter than about 10 s. The dashed lines in FIG. 7 represent S/D epitaxial structure 100 at different growth stages. The growth process of S/D epitaxial structure 100 is terminated when $d_1$ and $d_2$ shown in FIG. 1D become equal to or greater than about 2 nm and $W_{SD}$ is between about 5 nm and about 100 nm.

In some embodiments, the process parameters of the H-treatment such as the exposure time, the hydrogen dose, and the plasma power can be used to tune angle θ between facets 100f shown in FIG. 1D. For example, as the exposure time of the H-treatment increases in each cycle, angle θ increases.

As discussed above, the operations of precursor exposure, HCl vapor exposure, and H-treatment are performed serially in N cycles. In some embodiments, N is more than about 9 (e.g., N>9) to produce the hexagonal-shaped S/D epitaxial structure 100 shown in FIG. 7. Further, each of the N cycles includes an H-treatment with an exposure time between about 1 s and about 100 s.

Embodiments described herein are directed to S/D epitaxial structures with a hexagonal shape. The hexagonal-shaped S/D epitaxial structures described herein are advantageous over other S/D epitaxial structures (e.g., diamond-shaped S/D epitaxial structures) because the hexagonal-shaped S/D epitaxial structures sufficiently cover the end-portion of the fin structure, even after being subjected to a material loss during subsequent processing operations. In some embodiments, the hexagonal-shaped S/D epitaxial structures are grown so that top corners of the hexagonal-shaped S/D epitaxial structures abutting end-portions of the fin structure are raised with respect to top corners of the fin structure. In some embodiments, the corners of the hexagonal-shaped S/D epitaxial structures are raised by at least 2 nm above the top corners of the fin structure. In some embodiments, an H-treatment is introduced during growth of the S/D epitaxial structure to promote the growth of facets parallel to the (111) silicon crystal plane. In some embodiments, the H-treatment is introduced after an HCl vapor exposure. The H-treatment can convert chlorine-terminated surfaces of the S/D epitaxial structure to hydrogen-terminated surfaces that enhance the growth rate in a direction perpendicular to the (111) silicon crystal plane.

In some embodiments, a structure includes a substrate with a fin structure, which further includes a first portion and a second portion taller than the first portion. The structure also includes an isolation layer on the substrate covering bottom sidewalls of the second portion of the fin structure and sidewalls of the first portion of the fin structure. Further, the structure includes a S/D epitaxial structure grown on the first portion of the fin structure so that a distance between a facet of the S/D epitaxial structure proximal to a top corner of the second portion of the fin structure is greater than about 2 nm.

In some embodiments, a method includes forming a fin structure that includes a first portion and a second portion proximate to the first portion, forming a gate structure on the first portion of the fin structure, and recessing the second portion of the fin structure. The method further includes growing a S/D epitaxial structure on the recessed second portion of the fin structure, where growing the S/D epitaxial structure includes exposing the recessed second portion of the fin structure to a precursor and one or more reactant gases to form a portion of the S/D epitaxial structure. Growing the S/D epitaxial structure further includes exposing the portion of the S/D structure to an etching chemistry and exposing the portion of the S/D epitaxial structure to a hydrogen treatment to enhance growth of the S/D epitaxial structure.

In some embodiments, a method includes forming a fin structure on a substrate, forming a gate structure on a portion of the fin structure, and etching portions of the fin structure adjacent to the gate structure. The method further includes growing a S/D epitaxial structure on the etched portions of the fin structure, where growing the S/D epitaxial structure includes partially growing the S/D epitaxial structure on the etched portions of the fin structure. Growing the S/D epitaxial structure further includes exposing the partially-grown S/D epitaxial structure to an etching chemistry to terminate surfaces of the partially grown S/D epitaxial structure with chlorine atoms and treating the partially-grown S/D epitaxial structure with hydrogen to enhance a growth rate of the partially-grown S/D epitaxial structure in a direction perpendicular to an (111) crystal plane.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure that comprises a first portion and a second portion proximate to the first portion;
    forming a gate structure on the first portion of the fin structure;
    recessing the second portion of the fin structure; and
    growing a source/drain (S/D) epitaxial structure on the recessed second portion of the fin structure, wherein growing the S/D epitaxial structure comprises:
        exposing the recessed second portion of the fin structure to a precursor and one or more reactant gases to form a portion of the S/D epitaxial structure;
        exposing the portion of the S/D epitaxial structure to an etching chemistry;
        exposing the portion of the S/D epitaxial structure to a hydrogen treatment to form hydrogen-terminated surfaces; and
        epitaxially growing an additional portion of the S/D epitaxial structure on the hydrogen-terminated surfaces along a first crystal direction at a first growth rate and along a second crystal direction at a second growth rate different from the first growth rate.

2. The method of claim 1, wherein exposing the portion of the S/D epitaxial structure to the etching chemistry comprises exposing the fin structure to hydrochloric acid vapors to remove S/D epitaxial material on surfaces outside the recessed second portion of the fin structure.

3. The method of claim 1, wherein exposing the portion of the S/D epitaxial structure to the hydrogen treatment comprises exposing the portion of the S/D epitaxial structure to a hydrogen gas or to hydrogen radicals generated by an ion-free remote plasma.

4. The method of claim 1, wherein exposing the portion of the S/D epitaxial structure to the hydrogen treatment comprises converting chlorine-terminated surfaces of the S/D epitaxial structure to the hydrogen-terminated surfaces.

5. The method of claim 1, wherein exposing the portion of the S/D epitaxial structure to the etching chemistry comprises terminating surfaces of the S/D epitaxial structure with chlorine atoms.

6. A method, comprising:
forming a fin structure on a substrate;
forming a gate structure on a portion of the fin structure;
etching portions of the fin structure adjacent to the gate structure; and
growing a source/drain (S/D) epitaxial structure on the etched portions of the fin structure, wherein growing the S/D epitaxial structure comprises:
partially growing the S/D epitaxial structure on the etched portions of the fin structure;
exposing the partially-grown S/D epitaxial structure to an etching chemistry, wherein the etching chemistry removes a portion of the partially-grown S/D epitaxial structure and terminates surfaces of the partially-grown S/D epitaxial structure with chlorine atoms to form chlorine-terminated surfaces; and
treating the partially-grown S/D epitaxial structure with hydrogen to replace the chlorine-terminated surfaces with hydrogen-terminated surfaces, wherein the hydrogen-terminated surfaces enhance a growth rate of the partially-grown S/D epitaxial structure in a direction perpendicular to a (111) crystal plane.

7. The method of claim 6, wherein treating the partially-grown S/D epitaxial structure comprises exposing the partially-grown S/D epitaxial structure to hydrogen gas or ion-free hydrogen radicals.

8. The method of claim 6, wherein growing the S/D epitaxial structure comprises forming a hexagonal-shaped S/D epitaxial structure with adjoining (111) facets forming an angle greater than about 70°.

9. The method of claim 6, wherein growing the S/D epitaxial structure comprises growing a hexagonal-shaped S/D epitaxial structure with top (111) facets having a distance from top corners of the fin structure covered by the gate structure greater than about 2 nm.

10. The method of claim 6, wherein treating the partially-grown S/D epitaxial structure comprises terminating surfaces of the partially-grown S/D epitaxial structure with hydrogen atoms.

11. The method of claim 6, wherein treating the partially-grown S/D epitaxial structure comprises enhancing the growth rate of the partially-grown S/D epitaxial structure in the direction perpendicular to the (111) crystal plane greater than a growth rate in a direction perpendicular to a (100) crystal plane.

12. A method, comprising:
forming a fin structure on a substrate with a first fin portion and a second fin portion;
forming an insulating layer on the substrate adjacent to the fin structure;
forming an isolation structure on the insulating layer abutting bottom sidewalls of the second fin portion;
etching the second fin portion to form a recessed fin portion; and
epitaxially growing a source/drain (S/D) structure on the recessed fin portion with first and second facets parallel to (111) crystal planes growing at a first growth rate and a third facet parallel to (100) crystal planes growing at a second growth rate greater than the first growth rate, wherein the third facet is between the first and second facets and the first and second facets are proximal to first and second top corners of the first fin portion, respectively.

13. The method of claim 12, wherein forming the S/D structure comprises growing an epitaxial structure with a hexagonal shape.

14. The method of claim 12, wherein forming the S/D structure comprises growing an epitaxial structure with a top surface substantially parallel to a top surface of the first fin portion.

15. The method of claim 12, wherein forming the S/D structure comprises growing an epitaxial structure with a side surface in physical contact with a side surface of the first fin portion.

16. The method of claim 12, wherein forming the S/D structure comprises growing an epitaxial structure with a width between about 5 nm and about 100 nm along a direction perpendicular to a (110) crystal plane.

17. The method of claim 12, wherein forming the S/D structure comprises growing an epitaxial structure with a top surface having a width between about 2 nm and about 80 nm along a direction perpendicular to a (110) crystal plane.

18. The method of claim 12, wherein forming the S/D structure comprises:
growing an epitaxial structure on the recessed fin portion; and
exposing the epitaxial structure to hydrochloric acid vapors to terminate surfaces of the epitaxial structure with chlorine atoms.

19. The method of claim 12, wherein forming the S/D structure comprises:
growing an epitaxial structure on the recessed fin portion; and
performing a hydrogen treatment on the epitaxial structure.

20. The method of claim 12, further comprising forming a gate structure on the first fin portion, wherein the gate structure abuts a portion of a side surface of the SID epitaxial structure.

* * * * *